US012323123B2

United States Patent
Fukunaga et al.

(10) Patent No.: US 12,323,123 B2
(45) Date of Patent: Jun. 3, 2025

(54) PHASE SHIFTER COMPRISING SELECTABLE FIRST AND SECOND ALL-PASS FILTERS, WHERE THE ALL-PASS FILTERS INCLUDE CAPACITORS AND INDUCTORS OF DETERMINED VALUES TO ACHIEVE IMPEDANCE MATCHING

(71) Applicant: Mitsubishi Electric Corporation, Tokyo (JP)

(72) Inventors: Kei Fukunaga, Tokyo (JP); Masatake Hangai, Tokyo (JP); Ryota Komaru, Tokyo (JP); Yoshifumi Kawamura, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 213 days.

(21) Appl. No.: 18/079,377

(22) Filed: Dec. 12, 2022

(65) Prior Publication Data

US 2023/0106157 A1    Apr. 6, 2023

Related U.S. Application Data

(63) Continuation of application No. PCT/JP2020/030932, filed on Aug. 17, 2020.

(51) Int. Cl.
*H03H 7/19* (2006.01)
*H01P 1/18* (2006.01)
*H01Q 3/24* (2006.01)

(52) U.S. Cl.
CPC .............. *H03H 7/19* (2013.01); *H01P 1/18* (2013.01); *H01Q 3/24* (2013.01)

(58) Field of Classification Search
CPC .................................. H01P 1/18; H03H 7/19
(Continued)

(56) References Cited

U.S. PATENT DOCUMENTS

| 5,920,241 A * | 7/1999 | Mazzochette ............ H03H 7/19 333/171 |
| 9,774,310 B2 * | 9/2017 | Wu et al. ................ H03H 7/427 |
| 2011/0304409 A1 * | 12/2011 | Tamura .................. H03H 11/20 333/139 |

FOREIGN PATENT DOCUMENTS

| CN | 107332538 A | 11/2017 |
| JP | 2002-76810 A | 3/2002 |

(Continued)

OTHER PUBLICATIONS

International Search Report (PCT/ISA/210) issued in PCT/JP2020/030932, dated Oct. 27, 2020.
(Continued)

*Primary Examiner* — Benny T Lee
(74) *Attorney, Agent, or Firm* — Birch, Stewart, Kolasch & Birch, LLP (57) ABSTRACT

A phase shifter includes: a first all-pass filter; a second all-pass filter; a first switching switch to provide a signal to either one of the first all-pass filter and the second all-pass filter; and a second switching switch to select the signal having passed through the first all-pass filter or the signal having passed through the second all-pass filter, wherein the first all-pass filter includes two inductors and three capacitors, and the second all-pass filter includes two inductors and three capacitors, or the first all-pass filter includes three inductors and two capacitors, and the second all-pass filter includes three inductors and two capacitors, and element values of elements included in the first all-pass filter and element values of elements included in the second all-pass filter are determined by impedance at which impedance matching is achieved, a frequency of the signal, and a variable.

10 Claims, 6 Drawing Sheets (58) Field of Classification Search
USPC .......................................................... 333/139
See application file for complete search history.

(56) References Cited

FOREIGN PATENT DOCUMENTS

JP      2013-98744 A       5/2013
WO     WO2019/244244 A1   12/2019

OTHER PUBLICATIONS

Tang et al., "Large Bandwidth Digital Phase Shifters With All-Pass, High-Pass, and Low-Pass Networks", IEEE Transactions on Microwave Theory and Techniques, vol. 61, No. 6, Jun. 2013, pp. 2325-2331.
European Communication pursuant to Article 94(3) EPC for European Application No. 20950212.9, dated Feb. 21, 2024.
Anjos et al., "A 14-50-GHz Phase Shifter With All-Pass Networks for 5G Mobile Applications", IEEE Transactions on Microwave Theory and Techniques, vol. 68, No. 2, Feb. 2020, pp. 762-774.
Extended European Search Report for European Application No. 20950212.9, dated Jun. 30, 2023.
Tang et al., "Design of Large Bandwidth Phase Shifters Using Common Mode All-Pass Networks", IEEE Microwave and Wireless Components Letters, vol. 22, No. 2, Feb. 2012, pp. 55-57.

* cited by examiner

PHASE SHIFTER COMPRISING SELECTABLE FIRST AND SECOND ALL-PASS FILTERS, WHERE THE ALL-PASS FILTERS INCLUDE CAPACITORS AND INDUCTORS OF DETERMINED VALUES TO ACHIEVE IMPEDANCE MATCHING

CROSS-REFERENCE TO RELATED APPLICATION

This application is a continuation application of International Application PCT/JP2020/030932, filed on Aug. 17, 2020, all of which is hereby expressly incorporated by reference into the present application.

TECHNICAL FIELD

The present disclosure relates to a phase shifter and a phased array antenna device including the phase shifter.

BACKGROUND ART

A phased array antenna device generally has a phase shifter mounted thereon that can change the phase of a signal. The phase shifter is connected to an antenna element included in the phased array antenna device.

The following Non-Patent Literature 1 discloses a phase shifter in which a phase difference between a pass phase of a first path and a pass phase of a second path is the amount of phase shift. A circuit in which a plurality of first all-pass filters are connected in series is inserted in the first path, and a circuit in which a plurality of second all-pass filters are connected in series is inserted in the second path. The first all-pass filters each include two inductors and two capacitors as lumped-parameter elements. In addition, the second all-pass filters each include two inductors and two capacitors as lumped-parameter elements.

CITATION LIST

Non-Patent Literature

Non-Patent Literature 1: Xinyi Tang, et al, "Large Bandwidth Digital Phase Shifters with All-pass, High-pass, and Low-pass Networks", IEEE Transactions on MTTS, Vol 61, pp. 2325-2331 June 2013.

SUMMARY OF THE INVENTION

Technical Problem

In the phase shifter disclosed in Non-Patent Literature 1, a combination of lumped-parameter elements that achieves an amount of phase shift and a matching condition is uniquely determined, and a frequency characteristic of the amount of phase shift is also uniquely determined. Hence, there is a problem that in a desired frequency band, a phase-shift error is uniquely determined and a desired amount of phase shift may not be able to be obtained.

The present disclosure solves a problem such as that described above, and an object of the present disclosure is to obtain a phase shifter that can achieve a frequency characteristic of a desired amount of phase shift in a desired frequency band.

Solution to the Problem

A phase shifter according to the present disclosure includes a first all-pass filter including a plurality of elements; a second all-pass filter including a plurality of elements; a first switching switch to provide a signal to either one of the first all-pass filter and the second all-pass filter; and a second switching switch to select the signal having passed through the first all-pass filter or the signal having passed through the second all-pass filter, wherein the first all-pass filter includes a first inductor, a second inductor, a first capacitor, a second capacitor, and a third capacitor as the plurality of elements, the second all-pass filter includes a third inductor, a fourth inductor, a fourth capacitor, a fifth capacitor, and a sixth capacitor as the plurality of elements, the first inductor is inserted in a first path that connects the first switching switch to the second switching switch, a first end of the first capacitor is connected to a first end of the first inductor, a first end of the second capacitor is connected to a second end of the first inductor, a first end of the second inductor is connected to a second end of each of the first capacitor and the second capacitor, a first end of the third capacitor is connected to a second end of the second inductor, and a second end of the third capacitor is grounded, the third inductor is inserted in a second path that connects the first switching switch to the second switching switch, a first end of the fourth capacitor is connected to a first end of the third inductor, a first end of the fifth capacitor is connected to a second end of the third inductor, a first end of the fourth inductor is connected to a second end of each of the fourth capacitor and the fifth capacitor, a first end of the sixth capacitor is connected to a second end of the fourth inductor, and a second end of the sixth capacitor is grounded, and element values of the plurality of elements included in the first all-pass filter and element values of the plurality of elements included in the second all-pass filter are determined by impedance at which impedance matching is achieved, a frequency of the signal, and a variable.

Advantageous Effects of the Invention

According to the present disclosure, a frequency characteristic of the desired amount of phase shift can be achieved in a desired frequency band.

DETAILED DESCRIPTION OF THE EMBODIMENTS

To describe the present disclosure in more detail, embodiments for carrying out the present disclosure will be described below with reference to the accompanying drawings.

First Embodiment

Figure 1:
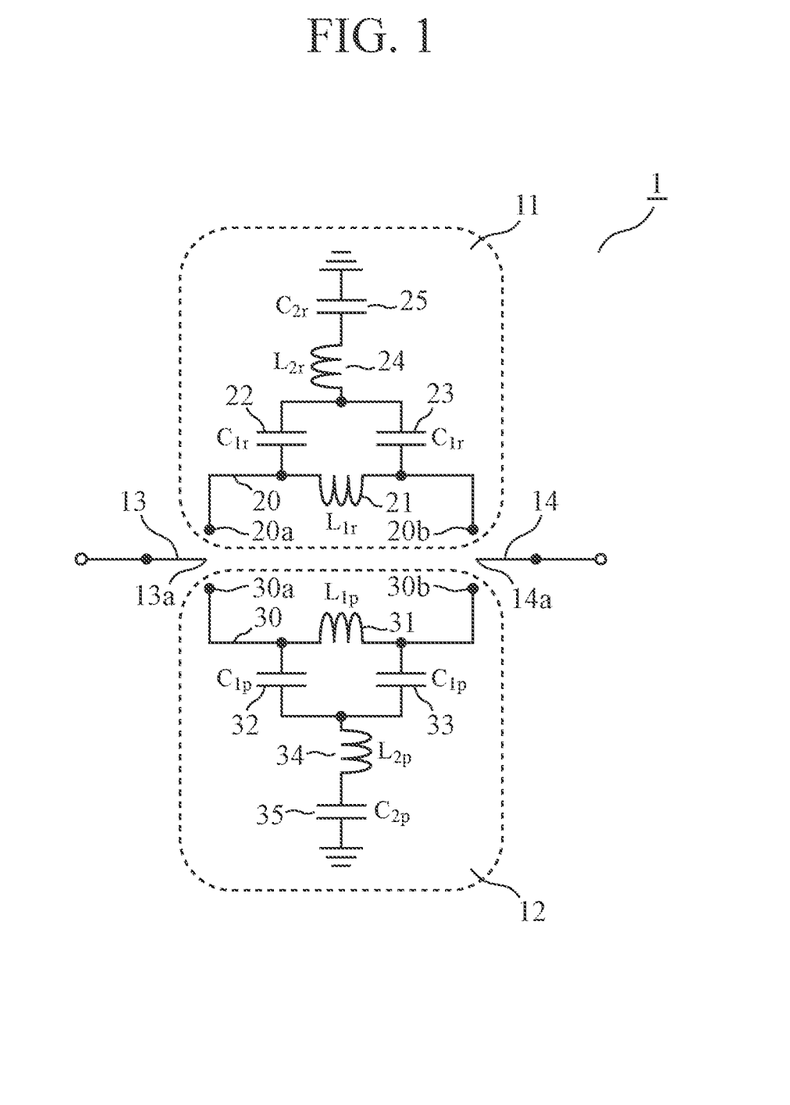
FIG. 1 is a configuration diagram showing a phase shifter according to a first embodiment.

FIG. 1 is a configuration diagram showing a phase shifter 1 according to a first embodiment.

The phase shifter 1 includes a first all-pass filter 11, a second all-pass filter 12, a first switching switch 13, and a second switching switch 14.

The first all-pass filter 11 includes two inductors and three capacitors as a plurality of elements.

Namely, the first all-pass filter 11 includes a first inductor 21, a second inductor 24, a first capacitor 22, a second capacitor 23, and a third capacitor 25 as a plurality of elements.

A pass phase $\Phi_1$ of the first all-pass filter 11 is determined by an element value of each of the first inductor 21, the second inductor 24, the first capacitor 22, the second capacitor 23, and the third capacitor 25.

The second all-pass filter 12 includes two inductors and three capacitors as a plurality of elements.

Namely, the second all-pass filter 12 includes a third inductor 31, a fourth inductor 34, a fourth capacitor 32, a fifth capacitor 33, and a sixth capacitor 35 as a plurality of elements.

A pass phase $\Phi_2$ of the second all-pass filter 12 is determined by an element value of each of the third inductor 31, the fourth inductor 34, the fourth capacitor 32, the fifth capacitor 33, and the sixth capacitor 35.

A connection terminal 13a of the first switching switch 13 is connected to either one of one end 20a of a first path 20 or one end 30a of a second path 30.

The first switching switch 13 provides a signal to either one of the first all-pass filter 11 or the second all-pass filter 12.

Namely, when the connection terminal 13a is connected to the one end 20a of the first path 20, the first switching switch 13 provides a signal to the first all-pass filter 11.

When the connection terminal 13a is connected to the one end 30a of the second path 30, the first switching switch 13 provides a signal to the second all-pass filter 12.

A connection terminal 14a of the second switching switch 14 is connected to either one of the other end 20b of the first path 20 or the other end 30b of the second path 30.

The second switching switch 14 selects a signal having passed through the first all-pass filter 11 or a signal having passed through the second all-pass filter 12.

Namely, when the connection terminal 13a of the first switching switch 13 is connected to the one end 20a of the first path 20 and the connection terminal 14a is connected to the other end 20b of the first path 20, the second switching switch 14 selects a signal having passed through the first all-pass filter 11.

When the connection terminal 13a of the first switching switch 13 is connected to the one end 30a of the second path 30 and the connection terminal 14a is connected to the other end 30b of the second path 30, the second switching switch 14 selects a signal having passed through the second all-pass filter 12.

The first path 20 is a path that connects the first switching switch 13 to the second switching switch 14. The first inductor 21 is inserted in the first path 20.

The second path 30 is a path that connects the first switching switch 13 to the second switching switch 14. The third inductor 31 is inserted in the second path 30.

The one end 20a of the first path 20 or the one end 30a of the second path 30 is connected to the connection terminal 13a of the first switching switch 13.

The other end 20b of the first path 20 or the other end 30b of the second path 30 is connected to the connection terminal 14a of the second switching switch 14.

The first inductor 21 is inserted in the first path 20.

The element value of the first inductor 21 is $L_{1r}$.

One end of the first capacitor 22 is connected to one end of the first inductor 21.

The other end of the first capacitor 22 is connected to each of the other end of the second capacitor 23 and one end of the second inductor 24.

The element value of the first capacitor 22 is $C_{1r}$.

One end of the second capacitor 23 is connected to the other end of the first inductor 21.

The other end of the second capacitor 23 is connected to each of the other end of the first capacitor 22 and the one end of the second inductor 24.

The element value of the second capacitor 23 is $C_{1r}$.

The one end of the second inductor 24 is connected to the other end of each of the first capacitor 22 and the second capacitor 23.

The other end of the second inductor 24 is connected to one end of the third capacitor 25.

The element value of the second inductor 24 is $L_{2r}$.

The one end of the third capacitor 25 is connected to the other end of the second inductor 24.

The other end of the third capacitor 25 is grounded.

The element value of the third capacitor 25 is $C_{2r}$.

The third inductor 31 is inserted in the second path 30.

The element value of the third inductor 31 is $L_{1p}$.

One end of the fourth capacitor 32 is connected to one end of the third inductor 31.

The other end of the fourth capacitor 32 is connected to each of the other end of the fifth capacitor 33 and one end of the fourth inductor 34.

The element value of the fourth capacitor 32 is $C_{1p}$.

One end of the fifth capacitor 33 is connected to the other end of the third inductor 31.

The other end of the fifth capacitor 33 is connected to each of the other end of the fourth capacitor 32 and the one end of the fourth inductor 34.

The element value of the fifth capacitor 33 is $C_{1p}$.

The one end of the fourth inductor 34 is connected to the other end of each of the fourth capacitor 32 and the fifth capacitor 33.

The other end of the fourth inductor 34 is connected to one end of the sixth capacitor 35.

The element value of the fourth inductor 34 is $L_{2p}$.

The one end of the sixth capacitor 35 is connected to the other end of the fourth inductor 34.

The other end of the sixth capacitor 35 is grounded.

The element value of the sixth capacitor 35 is $C_{2p}$.

Next, operations of the phase shifter 1 shown in FIG. 1 will be described.

The first all-pass filter 11 forms a phase reference circuit and the second all-pass filter 12 forms a phase-delay circuit.

The amount of phase shift $\Phi$ of the phase shifter 1 shown in FIG. 1 is determined by a phase difference between a pass phase $\Phi_1$ of the first all-pass filter 11 and a pass phase $\Phi_2$ of the second all-pass filter 12.

When the connection terminal 13a of the first switching switch 13 is connected to the one end 20a of the first path 20, a signal is provided to the first all-pass filter 11 from, for example, a transmitter which is not shown through the first switching switch 13.

When the connection terminal 14a of the second switching switch 14 is connected to the other end 20b of the first path 20, the signal having passed through the first all-pass filter 11 is outputted to, for example, an antenna element which is not shown through the second switching switch 14.

When the connection terminal 13a of the first switching switch 13 is connected to the one end 30a of the second path 30, a signal is provided to the second all-pass filter 12 from, for example, the transmitter which is not shown through the first switching switch 13.

When the connection terminal 14a of the second switching switch 14 is connected to the other end 30b of the second path 30, the signal having passed through the second all-pass filter 12 is outputted to, for example, the antenna element which is not shown through the second switching switch 14.

It is assumed that the impedance of each of the antenna element and the transmitter is $Z_0$, and the phase shifter 1 achieves both of impedance matching with the antenna element and impedance matching with the transmitter.

When the element values of the plurality of elements included in the first all-pass filter 11 and the element values of the plurality of elements included in the second all-pass filter 12 satisfy the following equation (1), the phase shifter 1 can achieve impedance matching at all frequencies.

$$L_{1r} = \frac{2}{\sqrt{G}} \frac{Z_0}{\omega_t}$$

$$L_{2r} = \frac{\sqrt{G}}{2} \frac{Z_0}{\omega_t}$$

$$L_{1p} = \frac{2}{\sqrt{G}} \frac{\omega_t Z_0}{\omega_0^2}$$

$$L_{2p} = \frac{\sqrt{G}}{2} \frac{\omega_t Z_0}{\omega_0^2}$$

$$C_{1r} = \frac{\sqrt{G}}{\omega_t Z_0}$$

$$C_{2r} = \frac{2\sqrt{G}}{G-1} \frac{1}{\omega_t Z_0}$$

$$C_{1p} = \sqrt{G} \frac{\omega_t}{\omega_0^2 Z_0}$$

$$C_{2p} = \frac{2\sqrt{G}}{G-1} \frac{\omega_t}{\omega_0^2 Z_0}$$

(1)

In equation (1), $\omega_0$ is the center angular frequency of a frequency band of each of the first all-pass filter 11 and the second all-pass filter 12, and $\omega_t$ and G are "free variables" (defined in more detail below) commonly used to determine the element values $L_{1r}$, $L_{2r}$, $L_{1p}$, $L_{2p}$, $C_{1r}$, $C_{2r}$, $C_{1p}$, and $C_{2p}$ above.

The amount of phase shift $\Phi$ of the phase shifter 1 shown in FIG. 1 is determined by a phase difference between the pass phase $\Phi_1$ of the first all-pass filter 11 and the pass phase $\Phi_2$ of the second all-pass filter 12, and the amount of phase shift $\Phi_0$ at the center angular frequency $\omega_0$ is represented by the following equation (2):

$$\Phi_0 = -4\tan^{-1}\left\{\sqrt{G}\left(\frac{\omega_0}{\omega_t} - \frac{\omega_t}{\omega_0}\right)\right\} \quad (2)$$

As shown in equation (2), each of $\omega_t$ and G is a free variable, meaning that each of $\omega_t$ and G are free to be changed in order to change the amount of phase shift $\Phi_0$ at the center angular frequency $\omega_0$, rather than being bound to particular values by other constraints or conditions.

Thus, by changing $\omega_t$ or G, the amount of phase shift $\Phi_0$ at the center angular frequency $\omega_0$ can be changed while matching at impedance $Z_0$ is achieved.

Note that when, as in the phase shifter described in Non-Patent Literature 1, each of the first all-pass filters and the second all-pass filters includes two inductors and two capacitors as a plurality of elements, the amount of phase shift $\Phi_0$ at the center angular frequency $\omega_0$ is represented as shown in the following equation (3):

$$\Phi_0 = -4\tan^{-1}\left\{\left(\frac{\omega_0}{\omega_t} - \frac{\omega_t}{\omega_0}\right)\right\} \quad (3)$$

The phase shifter described in Non-Patent Literature 1 has one free variable $\omega_t$ for changing the amount of phase shift $\Phi_0$ at the center angular frequency $\omega_0$. By determining $\omega_t$, a combination of elements is uniquely determined and the amounts of phase shift other than that at the center angular frequency $\omega_0$ are also uniquely determined, and thus, a frequency characteristic of the amount of phase shift is uniquely determined. Thus, there is little flexibility in design for widening frequency band. Hence, in a desired frequency band, a phase-shift error is uniquely determined, and thus, a desired amount of phase shift may not be able to be obtained.

The phase shifter 1 shown in FIG. 1 has two free variables $\omega_t$ and G for changing the amount of phase shift $\Phi$, and there is more flexibility in design for widening frequency band than in the phase shifter described in Non-Patent Literature 1.

Figure 2:
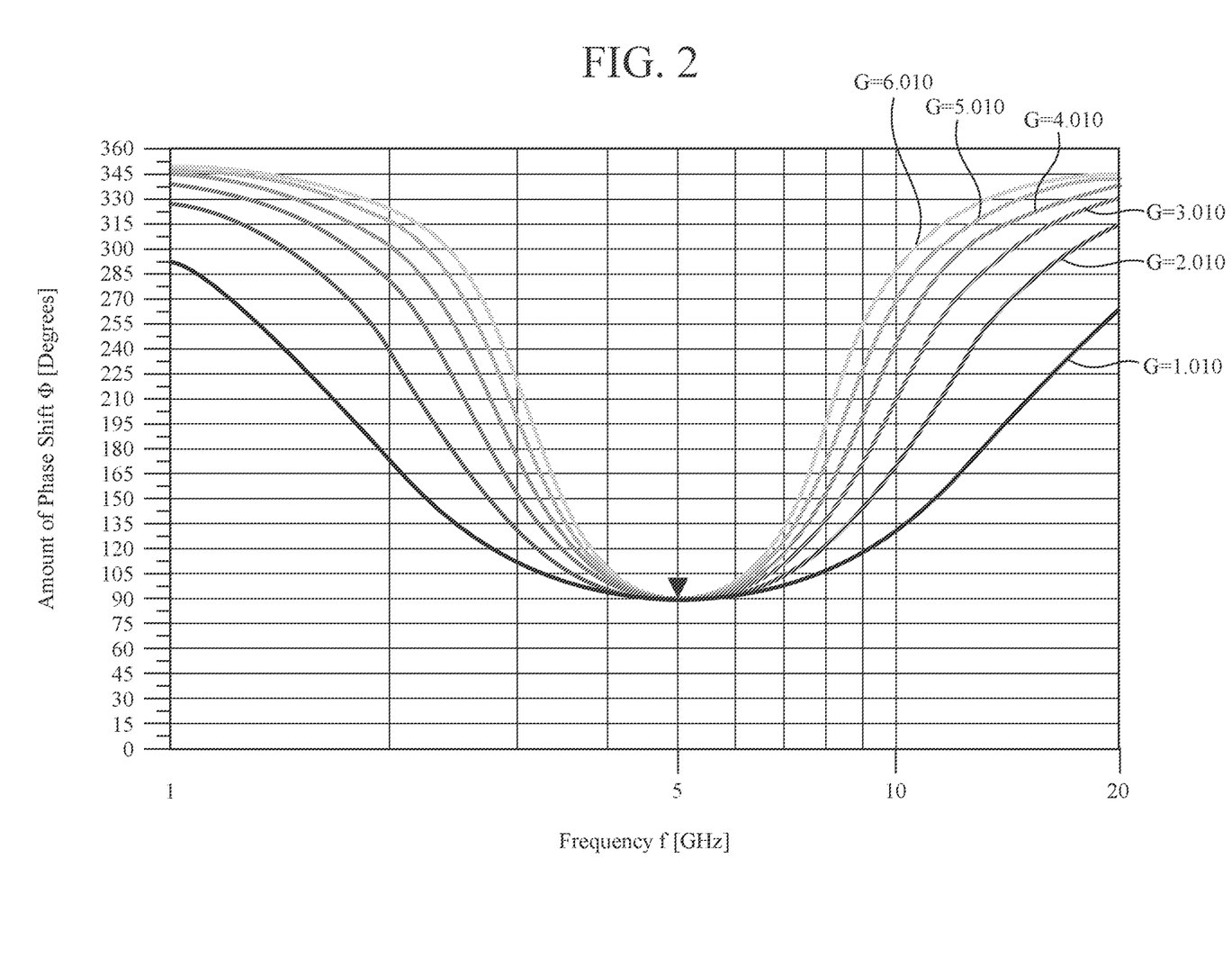
FIG. 2 is an explanatory diagram showing simulation results of an amount of phase shift $\Phi$ of the phase shifter shown in FIG. 1.

FIG. 2 is an explanatory diagram showing simulation results of the amount of phase shift $\Phi$ in [degrees] vs. Frequency in [GHz] of the phase shifter 1 shown in FIG. 1.

Simulations of FIG. 2 are shown for the phase shifter 1 that is designed with a center frequency $f_0$ of 5.0 [GHz] and an amount of phase shift $\Phi_0$ at the center frequency $f_0$ of 90 [degrees]. Here, a relationship between the center frequency $f_0$ and the center angular frequency $\omega_0$ is represented by $\omega_0 = 2\pi f_0$. As a free variable for changing a frequency characteristic of the amount of phase shift $\Phi$ of the phase shifter 1, the variable G is changed. Namely, the amount of phase shift $\Phi$ for G=1.010, G=2.010, G=3.010, G=4.010, G=5.010, and G=6.010 is simulated.

As shown in FIG. 2, it can be seen that by changing the variable G, the frequency characteristic of the amount of phase shift $\Phi$ changes.

In the above-described first embodiment as shown in FIG. 1, the phase shifter 1 is configured in such a manner that the phase shifter 1 includes the first all-pass filter 11 including a plurality of elements; the second all-pass filter 12 including a plurality of elements; the first switching switch 13 that provides a signal to either one of the first all-pass filter 11 and the second all-pass filter 12; and the second switching switch 14 that selects the signal having passed through the first all-pass filter 11 or the signal having passed through the second all-pass filter 12, and the first all-pass filter 11 includes two inductors and three capacitors as the plurality of elements, and the second all-pass filter 12 includes two inductors and three capacitors as the plurality of elements, and element values of the plurality of elements included in the first all-pass filter 11 and element values of the plurality of elements included in the second all-pass filter 12 are determined by impedance at which impedance matching is achieved, the frequency of the signal, and a variable. Thus, the phase shifter 1 can achieve a frequency characteristic of the desired amount of phase shift in a desired frequency band.

Second Embodiment

Figure 3:
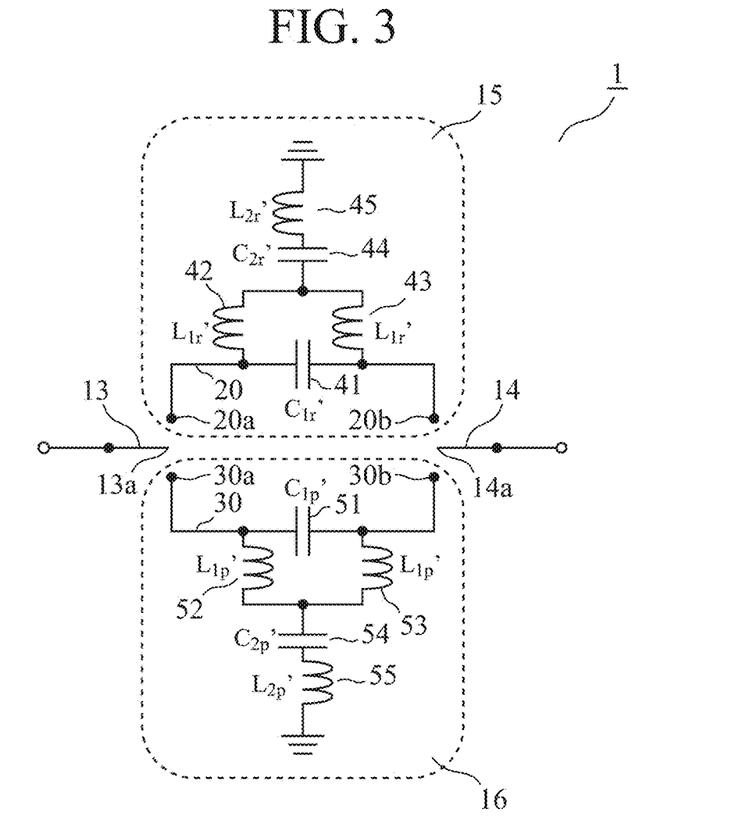
FIG. 3 is a configuration diagram showing a phase shifter according to a second embodiment.

In a second embodiment, a phase shifter 1 will be described in which a first all-pass filter 15 includes three inductors and two capacitors as a plurality of elements and a second all-pass filter 16 includes three inductors and two capacitors as a plurality of elements.

FIG. 3 is a configuration diagram showing the phase shifter 1 according to the second embodiment. In FIG. 3, the same reference signs as those of FIG. 1 indicate the same or corresponding portions and thus description thereof is omitted.

The phase shifter 1 includes the first all-pass filter 15, the second all-pass filter 16, a first switching switch 13, and a second switching switch 14.

The first all-pass filter 15 includes three inductors and two capacitors as a plurality of elements.

Namely, the first all-pass filter 15 includes a first inductor 42, a second inductor 43, a third inductor 45, a first capacitor 41, and a second capacitor 44 as a plurality of elements.

A pass phase $\Phi_1$ of the first all-pass filter 15 is determined by an element value of each of the first inductor 42, the second inductor 43, the third inductor 45, the first capacitor 41, and the second capacitor 44.

The second all-pass filter 16 includes three inductors and two capacitors as a plurality of elements.

Namely, the second all-pass filter 16 includes a fourth inductor 52, a fifth inductor 53, a sixth inductor 55, a third capacitor 51, and a fourth capacitor 54 as a plurality of elements.

A pass phase $\Phi_2$ of the second all-pass filter 16 is determined by an element value of each of the fourth inductor 52, the fifth inductor 53, the sixth inductor 55, the third capacitor 51, and the fourth capacitor 54.

The first capacitor 41 is inserted in a first path 20.

The element value of the first capacitor 41 is $C_{1r}'$.

One end of the first inductor 42 is connected to one end of the first capacitor 41.

The other end of the first inductor 42 is connected to each of the other end of the second inductor 43 and one end of the second capacitor 44.

The element value of the first inductor 42 is $L_{1r}'$.

One end of the second inductor 43 is connected to the other end of the first capacitor 41.

The other end of the second inductor 43 is connected to each of the other end of the first inductor 42 and the one end of the second capacitor 44.

The element value of the second inductor 43 is $L_{1r}'$.

The one end of the second capacitor 44 is connected to the other end of each of the first inductor 42 and the second inductor 43.

The other end of the second capacitor 44 is connected to one end of the third inductor 45.

The element value of the second capacitor 44 is $C_{2r}'$.

The one end of the third inductor 45 is connected to the other end of the second capacitor 44.

The other end of the third inductor 45 is grounded.

The element value of the third inductor 45 is $L_{2r}'$.

The third capacitor 51 is inserted in a second path 30.

The element value of the third capacitor 51 is $C_{1p}'$.

One end of the fourth inductor 52 is connected to one end of the third capacitor 51.

The other end of the fourth inductor 52 is connected to each of the other end of the fifth inductor 53 and one end of the fourth capacitor 54.

The element value of the fourth inductor 52 is $L_{1p}'$.

One end of the fifth inductor 53 is connected to the other end of the third capacitor 51.

The other end of the fifth inductor 53 is connected to each of the other end of the fourth inductor 52 and the one end of the fourth capacitor 54.

The element value of the fifth inductor 53 is $L_{1p}'$.

The one end of the fourth capacitor 54 is connected to the other end of each of the fourth inductor 52 and the fifth inductor 53.

The other end of the fourth capacitor 54 is connected to one end of the sixth inductor 55.

The element value of the fourth capacitor 54 is $C_{2p}'$.

The one end of the sixth inductor 55 is connected to the other end of the fourth capacitor 54.

The other end of the sixth inductor 55 is grounded.

The element value of the sixth inductor 55 is $L_{2p}'$.

Next, operations of the phase shifter 1 shown in FIG. 3 will be described.

The first all-pass filter 15 forms a phase reference circuit and the second all-pass filter 16 forms a phase-delay circuit.

The amount of phase shift $\Phi$ of the phase shifter 1 shown in FIG. 3 is determined by a phase difference between the pass phase $\Phi_1$ of the first all-pass filter 15 and the pass phase $\Phi_2$ of the second all-pass filter 16.

When a connection terminal 13a of the first switching switch 13 is connected to one end 20a of the first path 20, a signal is provided to the first all-pass filter 15 from, for example, a transmitter which is not shown through the first switching switch 13.

When a connection terminal 14a of the second switching switch 14 is connected to the other end 20b of the first path 20, the signal having passed through the first all-pass filter 15 is outputted to, for example, an antenna element which is not shown through the second switching switch 14.

When the connection terminal 13a of the first switching switch 13 is connected to one end 30a of the second path 30, a signal is provided to the second all-pass filter 16 from, for example, the transmitter which is not shown through the first switching switch 13.

When the connection terminal 14a of the second switching switch 14 is connected to the other end 30b of the second path 30, the signal having passed through the second all-pass filter 16 is outputted to, for example, the antenna element which is not shown through the second switching switch 14.

It is assumed that the impedance of each of the antenna element and the transmitter is $Z_0$, and the phase shifter 1 achieves both of impedance matching with the antenna element and impedance matching with the transmitter.

When the element values of the plurality of elements included in the first all-pass filter 15 and the element values of the plurality of elements included in the second all-pass filter 16 satisfy the following equation (4), the phase shifter 1 can achieve impedance matching at all frequencies.

$$L_{1r}' = \frac{1}{\sqrt{G}} \frac{Z_0}{\omega_t} \qquad (4)$$

-continued $$L'_{2r} = \frac{G-1}{2\sqrt{G}} \frac{Z_0}{\omega_t}$$

$$L'_{1p} = \frac{1}{\sqrt{G}} \frac{\omega_t Z_0}{\omega_0^2}$$

$$L'_{2p} = \frac{G-1}{2\sqrt{G}} \frac{\omega_t Z_0}{\omega_0^2}$$

$$C'_{1r} = \frac{\sqrt{G}}{2} \frac{1}{\omega_t Z_0}$$

$$C'_{2r} = \frac{2}{\sqrt{G}} \frac{1}{\omega_t Z_0}$$

$$C'_{1p} = \frac{\sqrt{G}}{2} \frac{\omega_t}{\omega_0^2 Z_0}$$

$$C'_{2p} = \frac{2}{\sqrt{G}} \frac{\omega_t}{\omega_0^2 Z_0}$$

In equation (4), $\omega_0$ is the center angular frequency of a frequency band of each of the first all-pass filter 15 and the second all-pass filter 16, and $\omega_t$ and G are free variables (defined above) commonly used to determine the element values $L_{1r}'$, $L_{2r}'$, $L_{1p}'$, $L_{2p}'$, $C_{1r}'$, $C_{2r}'$, $C_{1p}'$, and $C_{2p}'$ above.

The amount of phase shift Φ of the phase shifter 1 shown in FIG. 3 is determined by a phase difference between the pass phase $\Phi_1$ of the first all-pass filter 15 and the pass phase $\Phi_2$ of the second all-pass filter 16, and the amount of phase shift $\Phi_0$ at the center angular frequency $\omega_0$ is represented by the following equation (5):

$$\Phi_0 = -4\tan^{-1}\left\{\sqrt{G}\left(\frac{\omega_0}{\omega_t} - \frac{\omega_t}{\omega_0}\right)\right\} \quad (5)$$

As shown in equation (5), each of $\omega_t$ and G is a free variable for changing the amount of phase shift $\Phi_0$ at the center angular frequency $\omega_0$.

Thus, by changing $\omega_t$ or G, the amount of phase shift $\Phi_0$ at the center angular frequency $\omega_0$ can be changed while matching at impedance $Z_0$ is achieved.

In the above-described second embodiment as shown in FIG. 3, the phase shifter 1 is configured in such a manner that the phase shifter 1 includes the first all-pass filter 15 including a plurality of elements; the second all-pass filter 16 including a plurality of elements; the first switching switch 13 that provides a signal to either one of the first all-pass filter 15 and the second all-pass filter 16; and the second switching switch 14 that selects the signal having passed through the first all-pass filter 15 or the signal having passed through the second all-pass filter 16, and the first all-pass filter 15 includes three inductors and two capacitors as the plurality of elements, and the second all-pass filter 16 includes three inductors and two capacitors as the plurality of elements, and element values of the plurality of elements included in the first all-pass filter 15 and element values of the plurality of elements included in the second all-pass filter 16 are determined by impedance at which impedance matching is achieved, the frequency of the signal, and a variable. Thus, the phase shifter 1 can achieve a frequency characteristic of the desired amount of phase shift in a desired frequency band.

Third Embodiment

Figure 4:
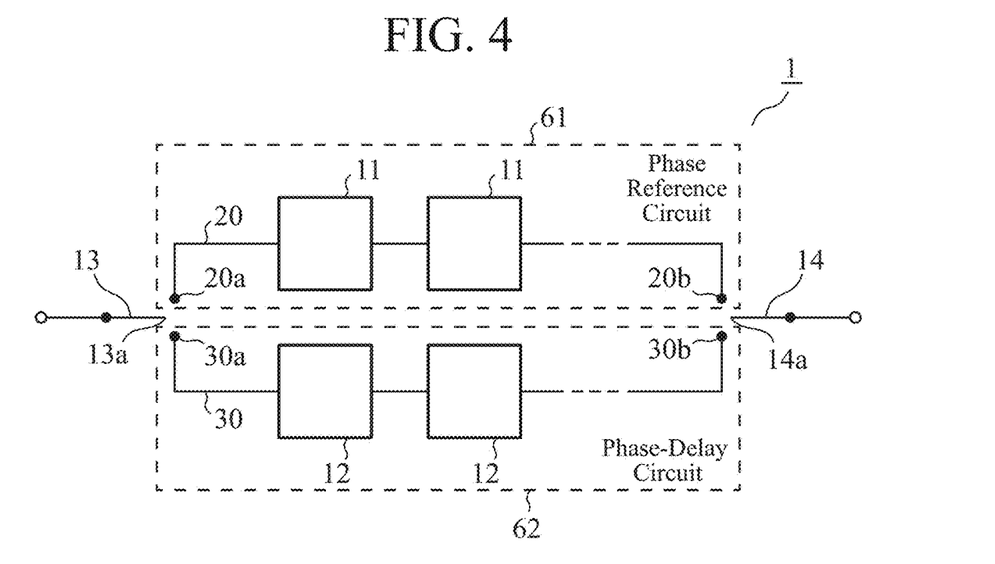
FIG. 4 is a configuration diagram showing a phase shifter according to a third embodiment.

In a third embodiment, a phase shifter 1 will be described in which a plurality of first all-pass filters 11 inserted in a first path 20 are connected in series and a plurality of second all-pass filters 12 inserted in a second path 30 are connected in series.

FIG. 4 is a configuration diagram showing the phase shifter 1 according to the third embodiment. In FIG. 4, the same reference signs as those of FIGS. 1 and 3 indicate the same or corresponding portions and thus description thereof is omitted.

A phase reference circuit 61 is provided between a first switching switch 13 and a second switching switch 14, and includes a plurality of first all-pass filters 11 shown in FIG. 1. The plurality of first all-pass filters 11 are connected in series with each other.

In the phase shifter 1 shown in FIG. 4, the phase reference circuit 61 includes the plurality of first all-pass filters 11. However, this is merely an example, and the phase reference circuit 61 may include a plurality of first all-pass filters 15 shown in FIG. 3, instead of the first all-pass filters 11 shown in FIG. 1.

A phase-delay circuit 62 is provided between the first switching switch 13 and the second switching switch 14, and includes a plurality of second all-pass filters 12 shown in FIG. 1. The plurality of second all-pass filters 12 are connected in series with each other.

In the phase shifter 1 shown in FIG. 4, the phase-delay circuit 62 includes the plurality of second all-pass filters 12. However, this is merely an example, and the phase-delay circuit 62 may include a plurality of second all-pass filters 16 shown in FIG. 3, instead of the second all-pass filters 12 shown in FIG. 1.

A pass phase of the phase reference circuit 61 is a total sum of pass phases $\Phi_1$ of the plurality of first all-pass filters 11, and a pass phase of the phase-delay circuit 62 is a total sum of pass phases $\Phi_2$ of the plurality of second all-pass filters 12.

The amount of phase shift Φ of the phase shifter 1 shown in FIG. 4 is determined by a phase difference between the pass phase of the phase reference circuit 61 and the pass phase of the phase-delay circuit 62.

Figure 5:
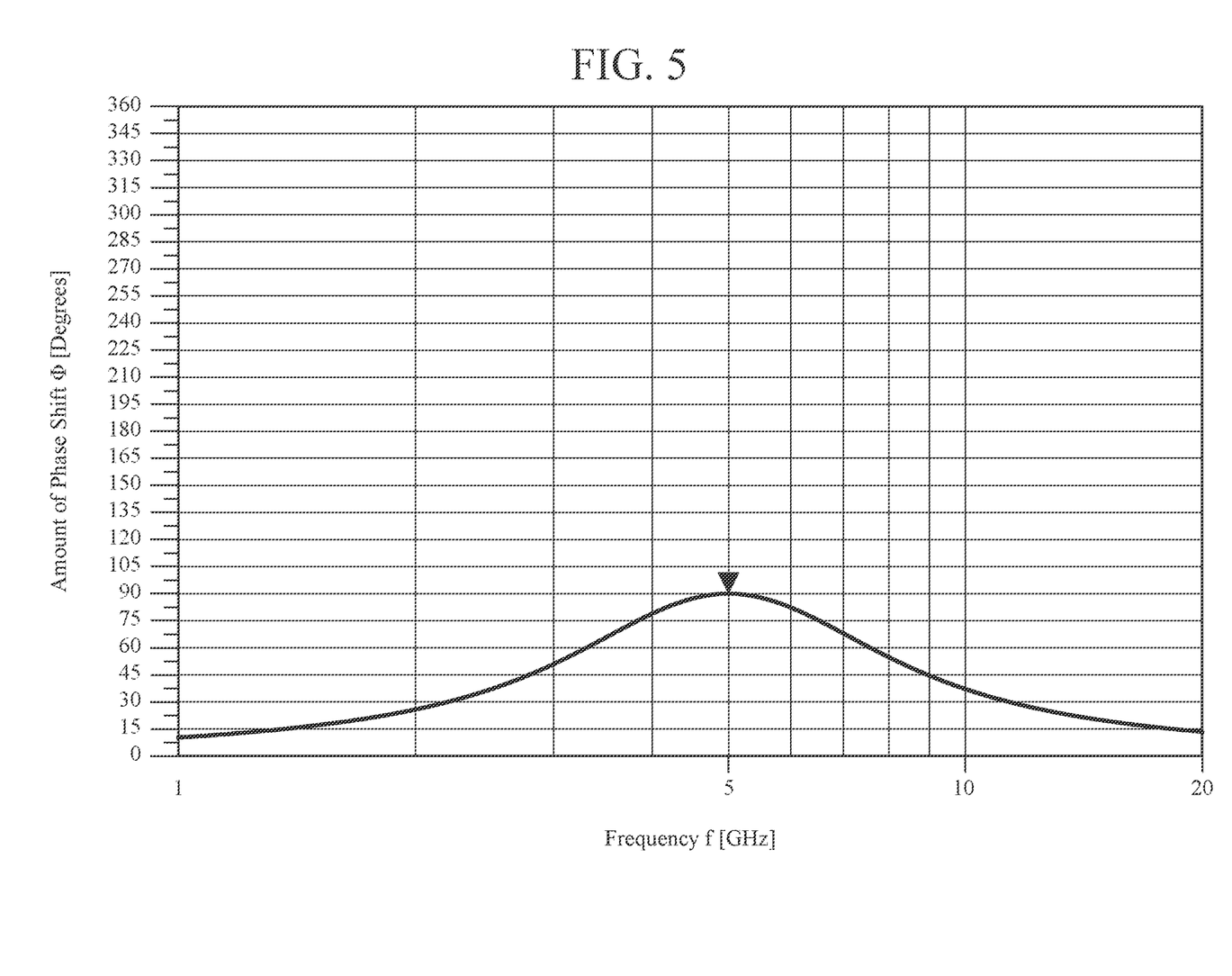
FIG. 5 is an explanatory diagram showing a simulation result of the amount of phase shift $\Phi$ obtained when a phase reference circuit includes only one first all-pass filter and a phase-delay circuit includes only one second all-pass filter.

FIGS. 5 and 2 are explanatory diagrams showing simulation results of the amount of phase shift Φ in [degrees] vs. Frequency in [GHz] obtained when the phase reference circuit 61 includes only one first all-pass filter 11 (hereinafter, referred to as "first all-pass filter 11 at the first stage") and the phase-delay circuit 62 includes only one second all-pass filter 12 (hereinafter, referred to as "second all-pass filter 12 at the first stage").

In a simulation of the amount of phase shift Φ shown in FIG. 5, each element value is designed in such a manner that when the center frequency $f_0$ is 5.0 [GHz], the amount of phase shift $\Phi_0$ at the center frequency $f_0$ is 90 degrees, and the amount of phase shift Φ of the phase shifter 1 has a maximal value at the center frequency $f_0$.

In simulations of the amount of phase shift Φ shown in FIG. 2, each element value is designed in such a manner that when the center frequency $f_0$ is 5.0 [GHz], the amount of phase shift $\Phi_0$ at the center frequency $f_0$ is 90 degrees, and the amount of phase shift Φ of the phase shifter 1 has a minimal value at the center frequency $f_0$.

It is assumed that the phase reference circuit 61 includes two first all-pass filters 11, and the phase-delay circuit 62 includes two second all-pass filters 12. In this case, a first all-pass filter 11 that is the first one from the first switching switch 13 is a first all-pass filter 11 at the first stage, and a first all-pass filter 11 that is the second one from the first switching switch 13 is a first all-pass filter 11 at the second stage.

In addition, a second all-pass filter 12 that is the first one from the first switching switch 13 is a second all-pass filter 12 at the first stage, and a second all-pass filter 12 that is the second one from the first switching switch 13 is a second all-pass filter 12 at the second stage.

It is assumed that each element value is designed in such a manner that for the amount of phase shift Φ produced by the first all-pass filter 11 at the first stage and the second all-pass filter 12 at the first stage, as shown in FIG. 5, the amount of phase shift $\Phi_0$ at the center frequency $f_0$ is 90 degrees, and the amount of phase shift Φ of the phase shifter 1 has a maximal value at the center frequency $f_0$.

On the other hand, it is assumed that each element value is designed in such a manner that for the amount of phase shift Φ produced by the first all-pass filter 11 at the second stage and the second all-pass filter 12 at the second stage, as shown in FIG. 2, the amount of phase shift $\Phi_0$ at the center frequency $f_0$ is 90 degrees, and the amount of phase shift Φ of the phase shifter 1 has a minimal value at the center frequency $f_0$.

Figure 6:
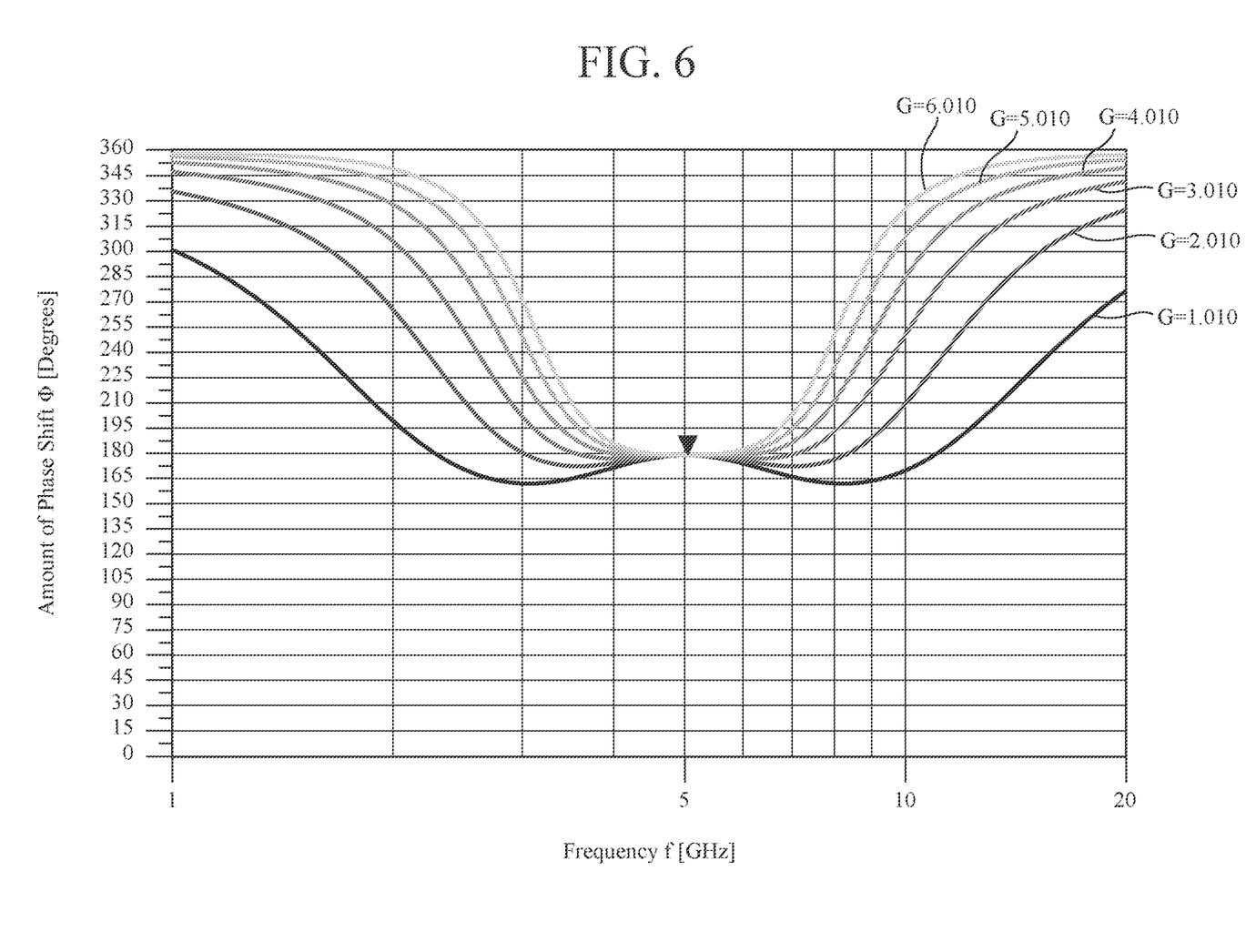
FIG. 6 is an explanatory diagram showing simulation results of the amount of phase shift $\Phi$ of the phase shifter shown in FIG. 4.

In a case of the above-described design, as shown in FIG. 6, frequency dependence of the amount of phase shift Φ produced by the first all-pass filter 11 at the first stage and the second all-pass filter 12 at the first stage and frequency dependence of the amount of phase shift Φ produced by the first all-pass filter 11 at the second stage and the second all-pass filter 12 at the second stage compensate for each other. By compensation for the frequency dependence, a phase-shift error of the phase shifter 1 is reduced.

FIG. 6 is an explanatory diagram showing simulation results of the amount of phase shift Φ in [degrees] vs. Frequency in [GHz] of the phase shifter 1 shown in FIG. 4.

In simulations of the amount of phase shift Φ, the center frequency $f_0$ is 5.0 [GHz] and a variable G for element values of elements included in the first all-pass filter 11 at the second stage and the second all-pass filter 12 at the second stage is changed. Namely, the amount of phase shift Φ for G=1.010, G=2.010, G=3.010, G=4.010, G=5.010, and G=6.010 is simulated.

As shown in FIG. 6, by changing the variable G for element values of elements included in the first all-pass filter 11 at the second stage and the second all-pass filter 12 at the second stage, it can be seen that the compensation for frequency dependence of the amount of phase shift produced by each of the first all-pass filter 11 at the first stage and the second all-pass filter 12 at the first stage is performed, and a phase-shift error of the phase shifter 1 is reduced.

Here, as shown in FIG. 4, it is assumed that the phase reference circuit 61 includes two first all-pass filters 11 and the phase-delay circuit 62 includes two second all-pass filters 12, and the amounts of phase shift for the first stage and the second stage both achieve the amount of phase shift $\Phi_0$ at the center frequency $f_0$.

In general, the phase reference circuit 61 may include N first all-pass filters 11 and the phase-delay circuit 62 may include N second all-pass filters 12, and the center frequency $f_0$ and the amount of phase shift $\Phi_0$ at the center frequency $f_0$ for each stage may vary between stages. In addition, each circuit may include only all-pass filters designed to achieve a maximal amount of phase shift Φ at each stage, or may include only all-pass filters designed to achieve a minimal amount of phase shift Φ at each stage. In addition, each circuit may include a combination of all-pass filters whose frequency characteristic of the amount of phase shift Φ at each stage has a maximal value and all-pass filters whose frequency characteristic of the amount of phase shift Φ at each stage has a minimal value. The order of cascade connection of the N first all-pass filters 11 may be in any order and the order of cascade connection of the N second all-pass filters 12 may be in any order.

Fourth Embodiment

Figure 7:
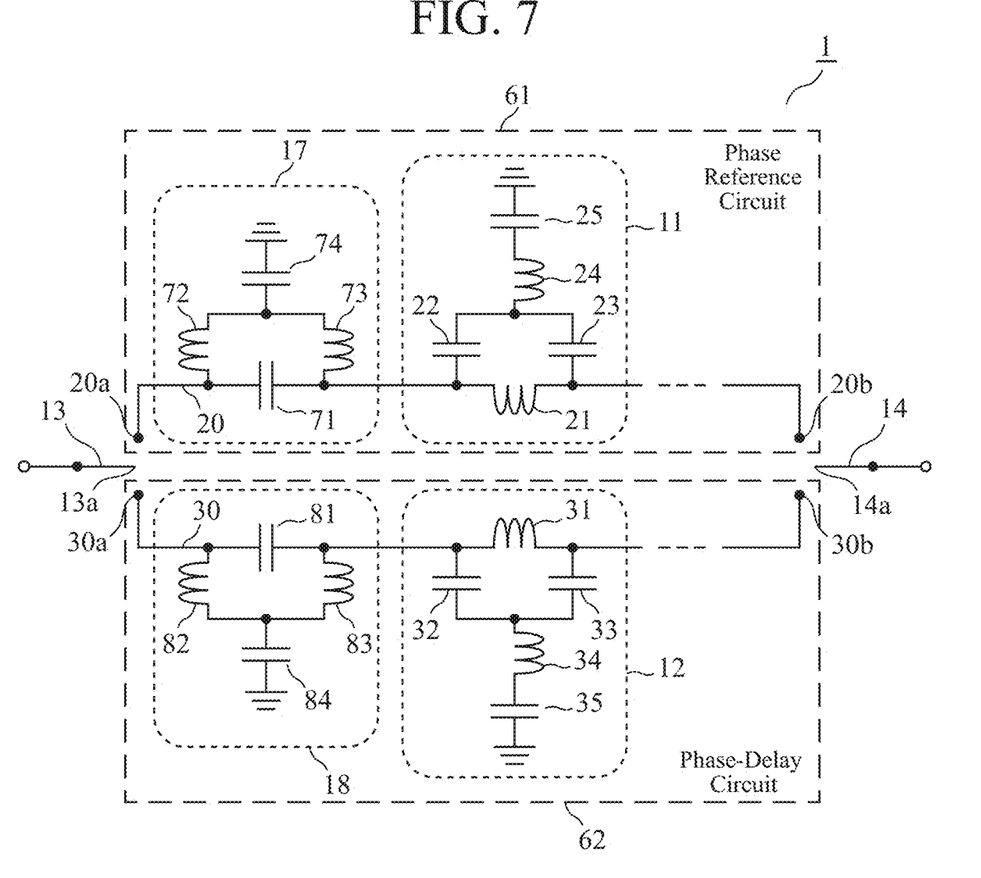
FIG. 7 is a configuration diagram showing a phase shifter according to a fourth embodiment.

In a fourth embodiment, a phase shifter 1 will be described in which a phase reference circuit 61 includes a third all-pass filter 17 in addition to a first all-pass filter 11, and a phase-delay circuit 62 includes a fourth all-pass filter 18 in addition to a second all-pass filter 12.

FIG. 7 is a configuration diagram showing the phase shifter 1 according to the fourth embodiment. In FIG. 7, the same reference signs as those of FIGS. 1, 3, and 4 indicate the same or corresponding portions and thus description thereof is omitted.

The third all-pass filter 17 is connected in series with the first all-pass filter 11.

The third all-pass filter 17 includes two inductors and two capacitors as a plurality of elements.

Namely, the third all-pass filter 17 includes inductors 72 and 73 and capacitors 71 and 74 as a plurality of elements.

The capacitor 71 is inserted in a first path 20.

One end of the inductor 72 is connected to one end of the capacitor 71.

The other end of the inductor 72 is connected to each of the other end of the inductor 73 and one end of the capacitor 74.

One end of the inductor 73 is connected to the other end of the capacitor 71.

The other end of the inductor 73 is connected to each of the other end of the inductor 72 and the one end of the capacitor 74.

The one end of the capacitor 74 is connected to each of the other end of the inductor 72 and the other end of the inductor 73.

The other end of the capacitor 74 is grounded.

The fourth all-pass filter 18 is connected in series with the second all-pass filter 12.

The fourth all-pass filter 18 includes two inductors and two capacitors as a plurality of elements.

Namely, the fourth all-pass filter 18 includes inductors 82 and 83 and capacitors 81 and 84 as a plurality of elements.

The capacitor 81 is inserted in a second path 30.

One end of the inductor 82 is connected to one end of the capacitor 81.

The other end of the inductor 82 is connected to each of the other end of the inductor 83 and one end of the capacitor 84.

One end of the inductor 83 is connected to the other end of the capacitor 81.

The other end of the inductor 83 is connected to each of the other end of the inductor 82 and the one end of the capacitor 84.

The one end of the capacitor 84 is connected to each of the other end of the inductor 82 and the other end of the inductor 83.

The other end of the capacitor 84 is grounded.

In the phase shifter 1 shown in FIG. 7, the phase reference circuit 61 includes the third all-pass filter 17 in addition to the first all-pass filter 11, and the phase-delay circuit 62 includes the fourth all-pass filter 18 in addition to the second all-pass filter 12.

However, this is merely an example, and the phase reference circuit 61 may include the third all-pass filter 17 in addition to a first all-pass filter 15, and the phase-delay circuit 62 may include the fourth all-pass filter 18 in addition to a second all-pass filter 16.

In addition, the phase reference circuit 61 may include the third all-pass filter 17 in addition to the first all-pass filter 11 and a first all-pass filter 15, and the phase-delay circuit 62 may include the fourth all-pass filter 18 in addition to the second all-pass filter 12 and a second all-pass filter 16.

The third all-pass filter 17 corresponds to the first all-pass filter described in Non-Patent Literature 1.

In addition, the fourth all-pass filter 18 corresponds to the second all-pass filter described in Non-Patent Literature 1.

Thus, a phase shifter that includes only the third all-pass filter 17 included in the phase reference circuit 61 and the fourth all-pass filter 18 included in the phase-delay circuit 62 cannot change a frequency characteristic of the amount of phase shift while impedance matching is achieved.

However, in the phase shifter 1 shown in FIG. 7, the phase reference circuit 61 includes the first all-pass filter 11 and the phase-delay circuit 62 includes the second all-pass filter 12, and thus, the amount of phase shift can be changed while impedance matching is achieved.

The elements included in the third all-pass filter 17 are two inductors 72 and 73 and two capacitors 71 and 74, and the number of the elements included in the third all-pass filter 17 is smaller than the number of elements included in the first all-pass filter 11.

In addition, the elements included in the fourth all-pass filter 18 are two inductors 82 and 83 and two capacitors 81 and 84, and the number of the elements included in the fourth all-pass filter 18 is smaller than the number of elements included in the second all-pass filter 12.

Thus, the phase shifter 1 shown in FIG. 7 can achieve a further size reduction than in the phase shifter 1 shown in FIG. 4 under conditions that the number of stages of all-pass filters included in the phase reference circuit 61 is the same and the number of stages of all-pass filters included in the phase-delay circuit 62 is the same.

In the phase shifter 1 shown in FIG. 7, as long as the third all-pass filter 17 includes two inductors 72 and 73 and two capacitors 71 and 74, disposition of each of the two inductors 72 and 73 and the two capacitors 71 and 74 is not limited to that shown in FIG. 7.

In FIG. 7, for example, the inductor 72 may be disposed at a location where the capacitor 71 is disposed, the inductor 73 may be disposed at a location where the capacitor 74 is disposed, the capacitor 71 may be disposed at a location where the inductor 72 is disposed, and the capacitor 74 may be disposed at a location where the inductor 73 is disposed.

In the phase shifter 1 shown in FIG. 7, as long as the fourth all-pass filter 18 includes two inductors 82 and 83 and two capacitors 81 and 84, disposition of each of the two inductors 82 and 83 and the two capacitors 81 and 84 is not limited to that shown in FIG. 7.

In FIG. 7, for example, the inductor 82 may be disposed at a location where the capacitor 81 is disposed, the inductor 83 may be disposed at a location where the capacitor 84 is disposed, the capacitor 81 may be disposed at a location where the inductor 82 is disposed, and the capacitor 84 may be disposed at a location where the inductor 83 is disposed.

Fifth Embodiment

A phased array antenna device including a phase shifter 1 according to any one of the first to fourth embodiments will be described.

Figure 8:
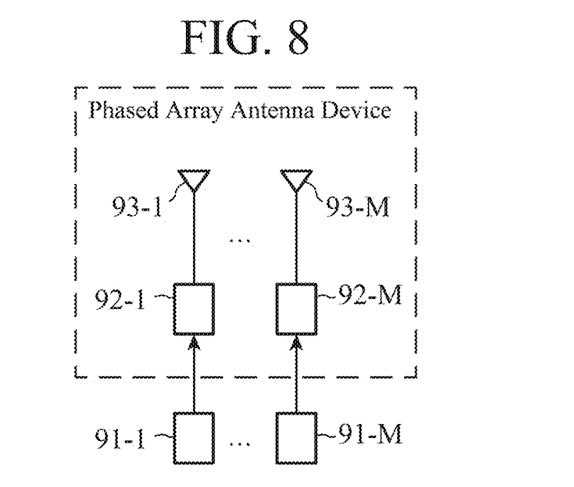
FIG. 8 is a configuration diagram showing a phased array antenna device according to a fifth embodiment.

FIG. 8 is a configuration diagram showing a phased array antenna device according to a fifth embodiment.

In FIG. 8, a transmitter 91-$m$ outputs a transmission signal to a phase shifter 92-$m$. Note that m=(1, ..., M), where M is an integer greater than or equal to 2.

The phase shifter 92-$m$ is the phase shifter 1 according to any one of the first to fourth embodiments.

The phase shifter 92-$m$ shifts the phase of the transmission signal outputted from the transmitter 91-$m$, and outputs the phase-shifted transmission signal to an antenna element 93-$m$.

The antenna element 93-$m$ radiates a radio wave based on the transmission signal whose phase has been shifted by the phase shifter 92-$m$ into space.

The phased array antenna device shown in FIG. 8 radiates radio waves based on transmission signals into space. However, this is merely an example, and the phased array antenna device may receive radio waves. When the antenna element 93-$m$ of the phased array antenna device receives a radio wave, the antenna element 93-$m$ outputs a reception signal of the radio wave to the phase shifter 92-$m$.

The phase shifter 92-$m$ shifts the phase of the reception signal outputted from the antenna element 93-$m$, and outputs the phase-shifted reception signal to a receiver which is not shown.

Note that in the present disclosure, above embodiments may be combined, and modifications to any component of each of the embodiments, or omissions of any component in each of the embodiments are possible.

INDUSTRIAL APPLICABILITY

The present disclosure is suitable for a phase shifter.
The present disclosure is suitable for a phased array antenna device including a phase shifter.

REFERENCE SIGNS LIST

1: Phase shifter, 11: First all-pass filter, 12: Second all-pass filter, 13: First switching switch, 13a: Connection terminal, 14: Second switching switch, 14a: Connection terminal, 15: First all-pass filter, 16: Second all-pass filter, 17: Third all-pass filter, 18: Fourth all-pass filter, 20: First path, 20a: One end, 20b: Other end, 21: First inductor, 22: First capacitor, 23: Second capacitor, 24: Second inductor, 25: Third capacitor, 30: Second path, 30a: One end, 30b: Other end, 31: Third inductor, 32: Fourth capacitor, 33: Fifth capacitor, 34: Fourth inductor, 35: Sixth capacitor, 41: First capacitor, 42: First inductor, 43: Second inductor, 44: Second capacitor, 45: Third inductor, 51: Third capacitor, 52: Fourth inductor, 53: Fifth inductor, 54: Fourth capacitor, 55: Sixth inductor, 61: Phase reference circuit, 62: Phase-delay circuit, 71 and 74: Capacitor, 72 and 73: Inductor, 81 and 84: Capacitor, 82 and 83: Inductor, 91-1 to 91-M: Transmitter, 92-1 to 92-M: Phase shifter, 93-1 to 93-M: Antenna element

What is claimed is:

1. A phase shifter comprising:
a first all-pass filter including a plurality of elements;
a second all-pass filter including a plurality of elements;
a first switch to provide a signal to either the first all-pass filter or the second all-pass filter; and
a second switch to select the signal having passed through the first all-pass filter or the signal having passed through the second all-pass filter, wherein the first all-pass filter includes a first inductor, a second inductor, a first capacitor, a second capacitor, and a third capacitor as the plurality of elements, the second all-pass filter includes a third inductor, a fourth inductor, a fourth capacitor, a fifth capacitor, and a sixth capacitor as the plurality of elements, the first inductor is inserted in a first path that connects the first switch to the second switch, a first end of the first capacitor is connected to a first end of the first inductor, a first end of the second capacitor is connected to a second end of the first inductor, a first end of the second inductor is connected to a second end of each of the first capacitor and the second capacitor, a first end of the third capacitor is connected to a second end of the second inductor, and a second end of the third capacitor is grounded, the third inductor is inserted in a second path that connects the first switch to the second switch, a first end of the fourth capacitor is connected to a first end of the third inductor, a first end of the fifth capacitor is connected to a second end of the third inductor, a first end of the fourth inductor is connected to a second end of each of the fourth capacitor and the fifth capacitor, a first end of the sixth capacitor is connected to a second end of the fourth inductor, and a second end of the sixth capacitor is grounded, and values of the plurality of capacitors and inductors included in the first and second all-pass filters are determined such that impedance matching is achieved in a desired frequency band.

2. The phase shifter according to claim 1, wherein the first all-pass filter is one of a plurality of first all-pass filters inserted in the first path are connected in series, and the second all-pass filter is one of a plurality of second all-pass filters inserted in the second path are connected in series.

3. The phase shifter according to claim 2, wherein the plurality of first all-pass filters have different pass phases, and the plurality of second all-pass filters have different pass phases.

4. A phased array antenna device comprising the phase shifter according to claim 3.

5. A phased array antenna device comprising the phase shifter according to claim 2.

6. A phased array antenna device comprising the phase shifter according to claim 1.

7. The phase shifter according to claim 1, comprising:

a third all-pass filter including two inductors and two capacitors; and a fourth all-pass filter including two inductors and two capacitors, wherein the third all-pass filter is connected in series with the first all-pass filter, and the fourth all-pass filter is connected in series with the second all-pass filter.

8. A phased array antenna device comprising the phase shifter according to claim 7.

9. The phase shifter according to claim 1, wherein the values of the plurality of capacitors and inductors included in the first and second all-pass filters are determined by respective equations linked by two common variables that are changeable in order to achieve a desired amount of phase shifting at a center frequency.

10. The phase shifter according to claim 9, wherein the respective equations also are linked by another common variable representing an impedance to be subject to the impedance matching.

* * * * *